United States Patent
Puah (10) Patent No.: US 7,396,752 B1
(45) Date of Patent: Jul. 8, 2008

(54) METHOD AND APPARATUS FOR REDUCING COLD JOINT DEFECTS IN FLIP CHIP PRODUCTS

(75) Inventor: Albert E. Puah, San Jose, CA (US)

(73) Assignee: Altera Corporation, San Jose, CA (US)

( * ) Notice: Subject to any disclaimer, the term of this patent is extended or adjusted under 35 U.S.C. 154(b) by 28 days.

(21) Appl. No.: 10/986,398

(22) Filed: Nov. 10, 2004

(51) Int. Cl.
*H01L 21/44* (2006.01)

(52) U.S. Cl. .............. 438/613; 257/737; 257/E23.069; 257/E21.508

(58) Field of Classification Search .......... 257/737, 257/E23.069, E21.508; 438/613
See application file for complete search history.

(56) References Cited

U.S. PATENT DOCUMENTS

| | | | |
|---|---|---|---|
| 6,088,236 A * | 7/2000 | Tomura et al. | 361/783 |
| 6,267,650 B1 * | 7/2001 | Hembree | 451/49 |
| 6,660,944 B1 * | 12/2003 | Murata et al. | 174/261 |
| 2002/0093108 A1 * | 7/2002 | Grigorov | 257/781 |

* cited by examiner

*Primary Examiner*—Asok K Sarkar
(74) *Attorney, Agent, or Firm*—Morgan, Lewis & Bockius LLP

(57) ABSTRACT

An electronic device is disclosed with solder bumps treated to improve coplanarity and reduce the effects of poor solder bump surface quality, and a method of constructing same. An electronic device is placed against a flat plate and a controlled amount of force is applied to press together the electronic device and flat plate. The taller solder bumps are compressed, reducing non-coplanarity of the solder bumps. The controlled amount of force exposes the bulk material of a solder bump coated with a foreign material. A layer of abrasive, electro-conductive particles that is harder than the foreign material, dispersed on the surface of the flat plate and firmly held in place, may also puncture the foreign material and expose the solder bump bulk material when the controlled amount of force is applied.

4 Claims, 8 Drawing Sheets

METHOD AND APPARATUS FOR REDUCING COLD JOINT DEFECTS IN FLIP CHIP PRODUCTS

This invention relates generally to the packaging of electronic devices. More particularly, this invention relates to the preparation of an electronic device that reduces cold joint defects in flip chip (FC) products.

BACKGROUND OF THE INVENTION

Figure 1:
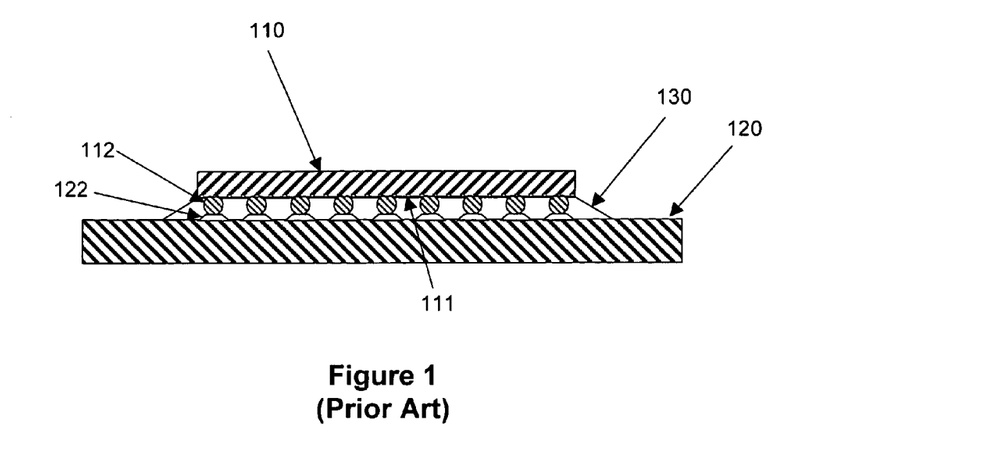
FIG. 1 is a cross-sectional view of a conventional FC packages.

FIG. 1 is a cross-sectional view of a conventional FC package. A pattern of solder bumps 112 is formed on the side of a chip 110 that carries the integrated circuit. A complementary pattern of solder pads 122 is formed on substrate 120. Chip 110 is then flipped upside down to the orientation shown in FIG. 1, its pattern of solder bumps is aligned with the pattern of solder pads formed on substrate 120, and solder bumps 112 of chip 110 are brought into contact with solder pads 122 of substrate 120. Chip 110 and substrate 120 are then heated while in this alignment so that the solder in solder bumps 112 and solder pads 122 flows together. Upon cooling, the solder forms mechanical and electrical joints (i.e., solder joints) that connect chip 110 to substrate 120. As a result, the shape of the solder bump and pad cross-section changes from what is shown in FIG. 1 to the cross-section shown in FIG. 2. Additionally, an underfill 130 is added to the package to increase the package's structural stability.

Figure 2:
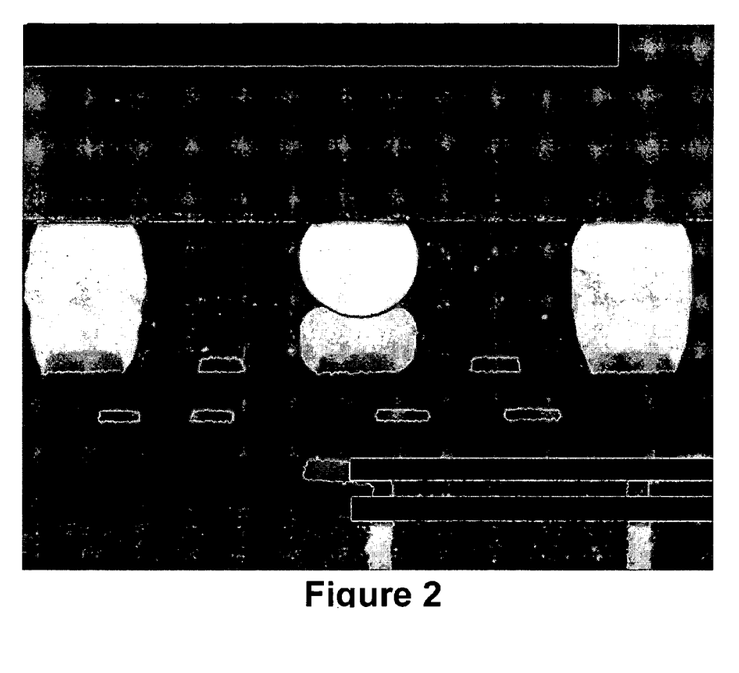
FIG. 2 is a scanning electron microphotograph of a cold joint flanked by two goods bonds in a conventional FC package.

When the solder in the solder bumps and the solder pads do not contact each other, cold joint defects result due to unsuccessful metallurgical bonding between pairs of solder bumps and solder pads. FIG. 2 is a scanning electron microphotograph of three solder joints with one cold joint in the middle and two good joints on the left and right. Since an electrical connection does not form between the solder bump and the solder pad in the cold joint, the joint fails to perform the electrical function for which it was designed.

Two factors that contribute to cold joint defects are non-coplanarity of solder bumps and poor solder bump surface quality.

First, non-uniformity of solder bump height often results in cold joints. Solder bumps are typically created in a reflow process in which the solder bumps are subjected to a temperature above their melting point so that the solder is in a liquid state, and the surface tension of the molten material pulls the material into a spherical shape. The solder bumps are allowed to cool and solidify, retaining the spherical shape. Due to process limitations, however, it is extremely difficult to ensure that all solder bumps are identical in volume. As a result, when the solder bumps are formed on the chip, the bump tips are not all at a common contact plane. This non-uniformity is further increased by the selective probing of some but not all of the solder bumps. Due to the high degree of electrical redundancy, close physical proximity, and the sheer number of solder bumps on each chip, only selected solder bumps are probed. The probing action invariably depresses the tip of the probed solder bumps, which further increases the non-coplanarity of the solder bumps.

Figure 3:
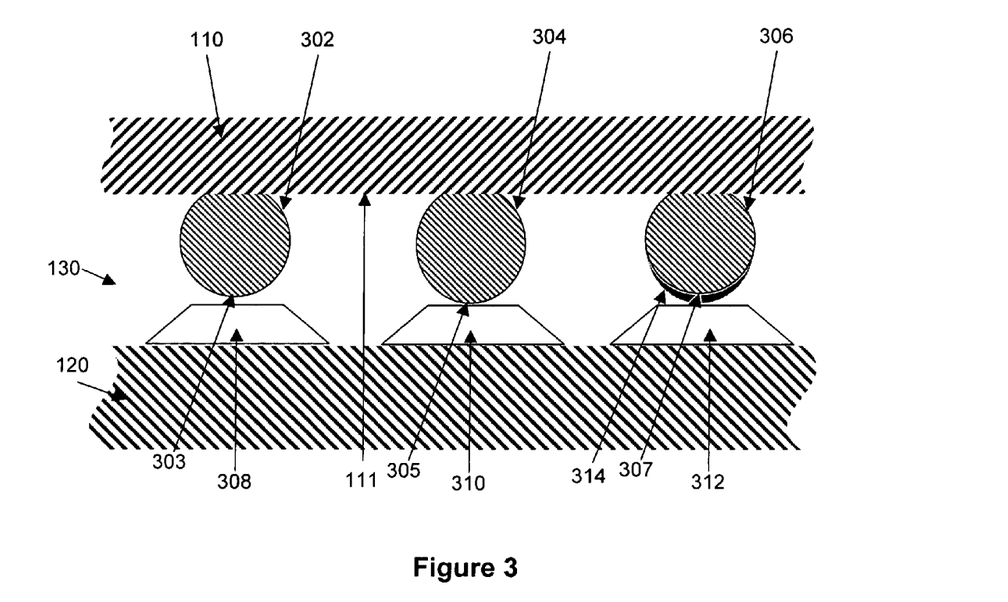
FIG. 3 is a cross-sectional view of non-coplanar solder bumps, including a solder bump covered with a coating of foreign material, relative to corresponding solder pads on a substrate.

FIG. 3 depicts three solder bumps 302, 304, and 306 of different sizes mounted on a chip 110. Solder bumps 302, 304, and 306 are aligned with solder pads 308, 310, and 312, respectively, on substrate 120. We will refer to a first solder bump as "shorter" than a second solder bump if the second solder bump extends farther from the chip surface than the first, and as "taller" than the second solder bump if the first solder bump extends farther from the chip surface than the second. Solder bump 302, as depicted, is shorter than solder bump 304, so tip 305 of solder bump 304 extends farther from chip 110 than tip 303 of solder bump 302. Since the tallest solder bumps usually determine the contact plane, the shorter solder bumps may fail to contact their solder pads. The lack of contact between the shorter solder bumps and their solder pads may prevent the formation of a physical connection between the shorter solder bumps and their solder pads, which results in cold joints.

Figure 4:
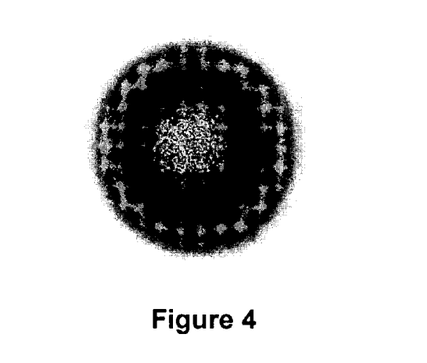
FIG. 4 is a photograph of a solder bump with foreign material on its surface.

Second, poor solder bump surface quality also results in cold joints. FIG. 4 is a photograph of the surface of a solder bump that is coated with a foreign material. This foreign material may have any of several origins. Solder bumps are sometimes coated with residual process material left behind by the reflow process. During reflow, this residual material tends to float to the solder bump tips at which the solder bumps contact the solder pads in the electronic package. Solder bumps can also develop an oxide layer when they are exposed to the atmosphere. Another source for contamination is the probe tips that are used to probe solder bumps on various chips. As the same probe is used to probe solder bump after solder bump, foreign material from one solder bump may be transferred to other solder bumps. These residual materials on the solder bumps are usually of poor electrical conductivity, and generally impede formation of physical connections between solder bumps and solder pads.

When the surface of a solder bump is coated with a material that is different from the material of the solder bump, this foreign material often prevents the material of the solder bump from contacting the material of the solder pad, which results in cold joints. Further, since the foreign material is usually of poor electrical conductivity, any connection between the coated solder bump and its solder pad via the foreign material is usually poor. The foreign material effectively functions as a barrier between the coated solder bump and the solder pad. In FIG. 3, solder bump 306 is coated with a foreign material 314. Acting as a barrier between coated solder bump 306 and solder pad 312 when the chip is packaged, foreign material 314 prevents coated solder bump 306 from contacting and forming a connection with solder pad 312, which results in a cold joint being formed. Referring again to FIG. 2, a gap between the solder bump and the solder pad in the cold joint (middle joint in FIG. 2) is clearly seen as the dark line between the solder bump and the solder pad.

In view of the foregoing discussion, it is highly desirable to provide an improved method and apparatus to prepare electronic devices that reduce cold joint defects resulting from non-coplanarity of the solder bumps and poor solder bump surface quality.

SUMMARY OF THE INVENTION

The present invention addresses the aforementioned problems of solder bump non-coplanarity and poor solder bump surface quality. In one embodiment, a controlled amount of force is applied to press together an electronic device with solder bumps and a flat plate. The controlled amount of force compresses the tips of the taller solder bumps against the flat plate and reduces the height of the taller solder bumps, thereby making all of the solder bumps more uniform in height (i.e., increasing the coplanarity of the tips of the solder bumps). Increased coplanarity increases the chance that the shorter solder bumps contact and form physical bonds with their solder pads when the electronic device is packaged.

In another embodiment, a layer of abrasive electroconductive particles that are harder than the foreign material that may coat the solder bump tips is dispersed and held in place on a surface of the flat plate before positioning the electronic device against the layer of particles and applying the controlled amount of force. The controlled amount of force causes the particles to puncture the layers of foreign material that accumulate or form on the solder bump tips. When the electronic device is removed from the flat plate, the particles are left behind on the flat plate and a portion of the foreign material is deformed such that the bulk of the solder bump is exposed. In a further embodiment, the abrasive electroconductive particles are harder than the material of the solder bumps, and the surface of the layer of particles is planar.

In yet another embodiment, a flat plate composed of an electroconductive material that is harder than the foreign material and with an abrasive surface structure is used. In yet a further embodiment, the flat plate is composed of an electroconductive material that is harder than the material of the solder bumps.

BRIEF DESCRIPTION OF THE DRAWINGS

For a better understanding of the invention, reference should be made to the following detailed description taken in conjunction with the accompanying drawings, in which.

DETAILED DESCRIPTION ON THE INVENTION

Figure 5:
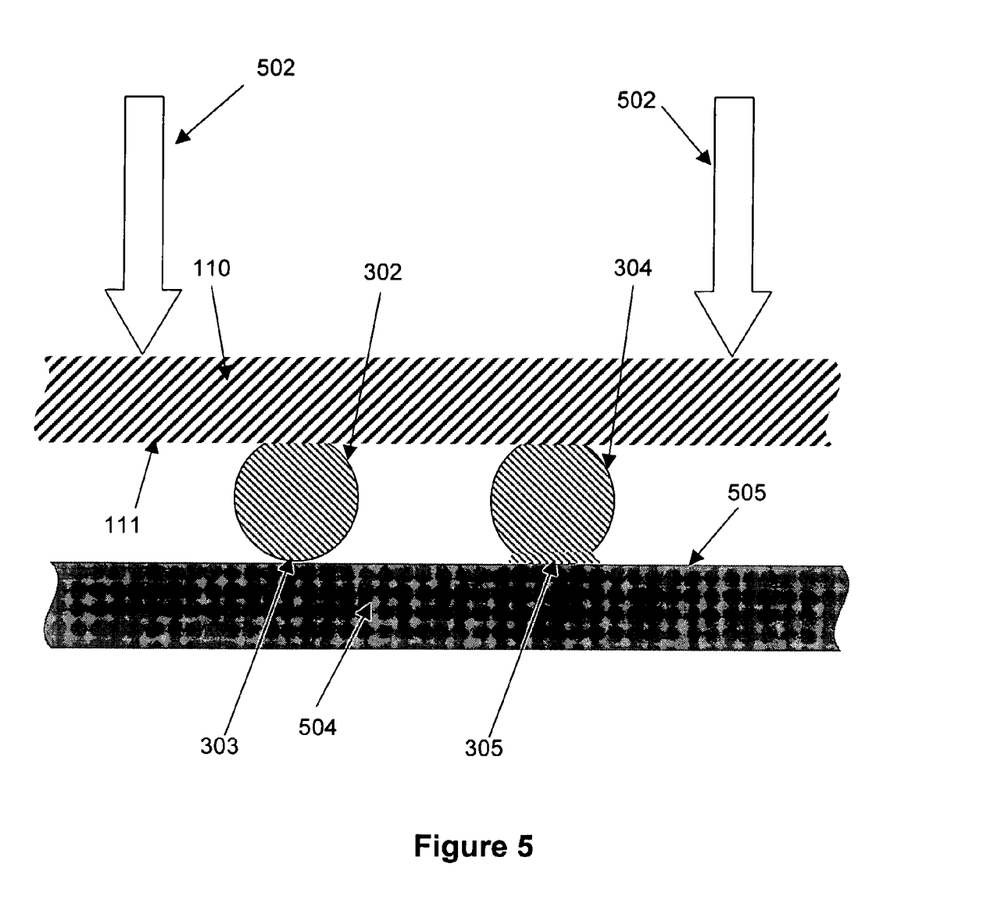
FIG. 5 is a cross-sectional view of an embodiment of the invention in which a controlled amount of force is applied to press together a chip with non-coplanar solder bumps and a flat plate.

Before an electronic device is packaged, the electronic device is prepared in such a way as to minimize the effects of non-coplanarity and poor surface quality of the solder bumps. In one embodiment of the present invention, a controlled amount of force is applied to press together an electronic device and a flat plate to reduce the non-coplanarity of the electronic device's solder bumps. Electronic devices are often temporarily placed upon a flat plate after being flipped over but before being packaged. Current industry practice is to exert the least amount of force upon such electronic devices as possible. In FIG. 5, chip 110 having a first solder bump 304 and a shorter second solder bump 302 on chip surface 111 is placed against flat plate surface 505 of flat plate 504. Typically, chip 110 will have numerous other solder bumps (not shown). In contrast to conventional industry practice, a controlled amount of force represented by arrows 502 is applied to chip 110 while chip surface 111 is parallel to flat plate surface 505. As a result, tip 305 of solder bump 304 is compressed against flat plate 504. Simultaneously, the distance between tip 303 of shorter solder bump 302 and flat plate surface 505 is decreased, thereby putting tip 303 of shorter bump 302 closer and maybe even in the plane in which solder bump 304 would contact its solder pad in the electronic package. The controlled amount of force should press together chip 110 and flat plate 504 by slightly more (approximately 10-15 microns more) than the expected amount of non-coplanarity of solder bump 304 and shorter solder bump 302. By compressing the taller solder bumps so that their height is more in line with that of the shorter solder bumps, the non-coplanarity of the solder bumps is reduced and the shorter solder bumps have an increased likelihood of forming good joints with the solder pads. The controlled amount of force is preferably applied immediately prior to packaging the electronic device to minimize oxidation or contamination of the solder bump surfaces.

Prior to removing an electronic device from a flat plate to be packaged, a removal mechanism usually travels toward the electronic device. The distance past which the removal mechanism contacts the electronic device is called "over-travel." In another embodiment of the present invention, the controlled amount of force is applied by the over-travel of the removal mechanism that removes the electronic device from the electronic device. Alternatively, the controlled amount of force could be applied by holding the electronic device in a fixed position and moving the flat plate toward the device. In either case, the flat plate and the electronic device are pressed together.

Figure 6A:
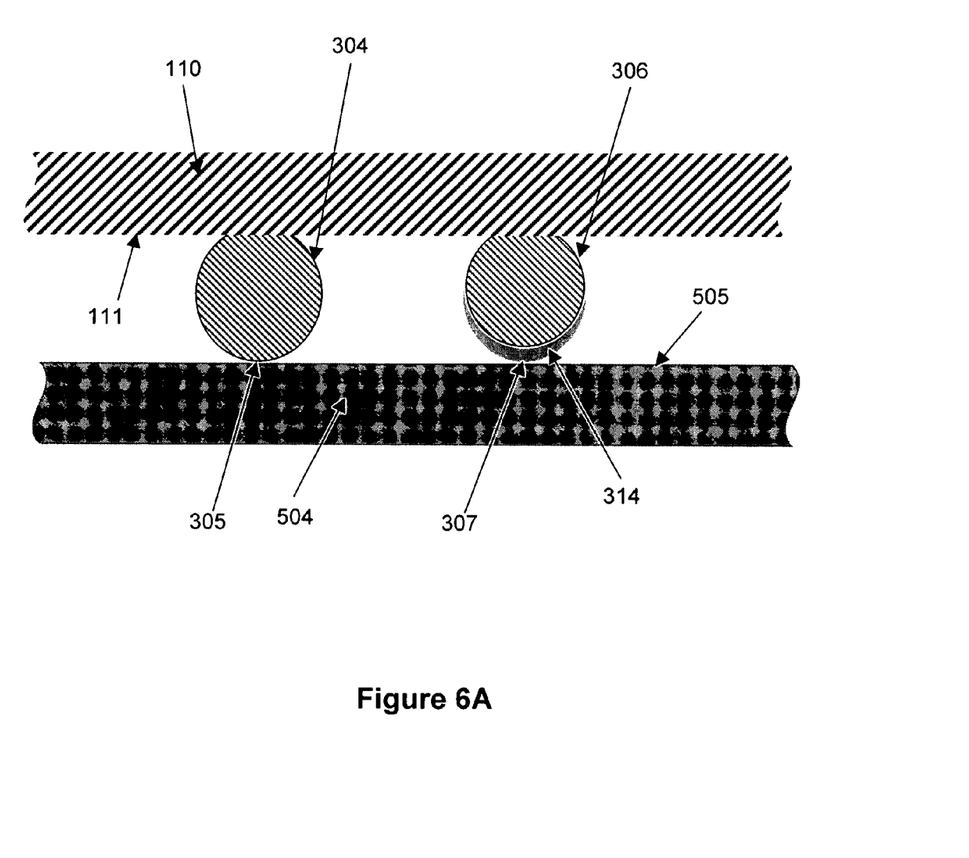
FIGS. 6A and 6B are cross-sectional views of another embodiment of the invention in which a controlled amount of force is applied to press together a chip with a solder bump covered by a coating of foreign material.
Figure 6B:
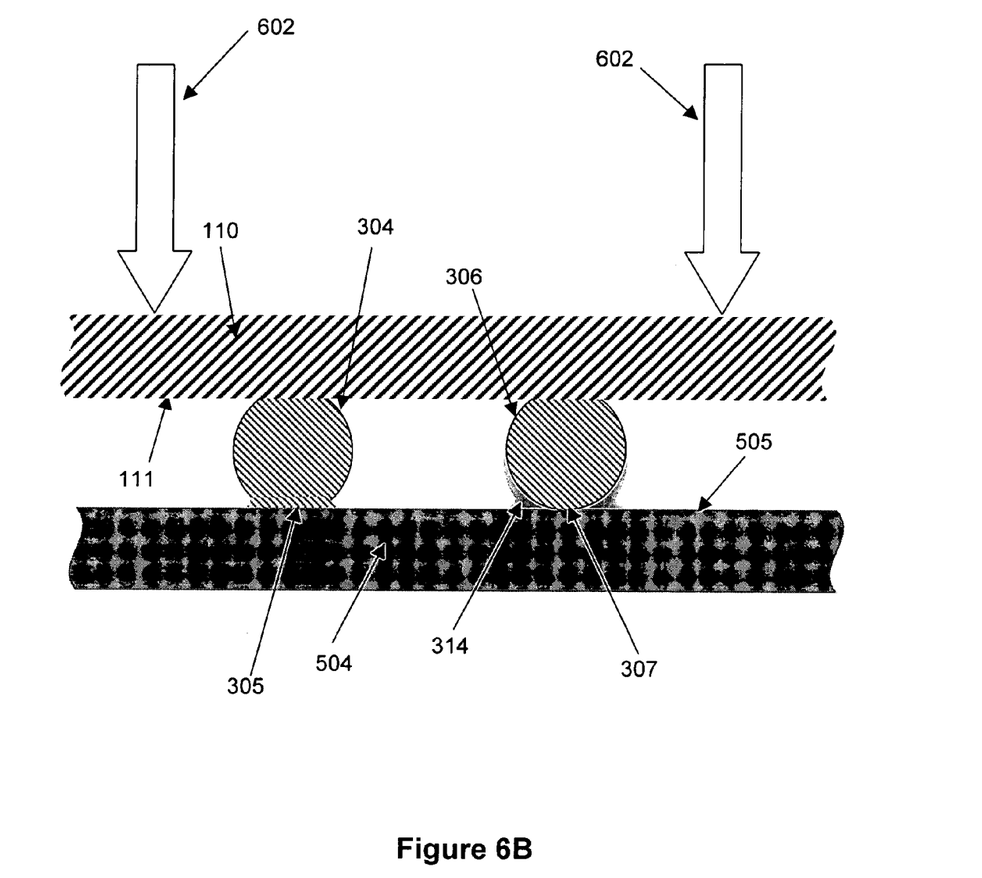

In yet another embodiment of the present invention, a controlled amount of force is applied to press together an electronic device and a flat plate to expose the bulk material of solder bumps that are coated with a foreign material. In FIG. 6A, a coated solder bump 306, though coplanar with solder bump 304, will likely not form a good joint with a solder pad because foreign material 314 acts as a barrier between the bulk material of coated solder bump 306 and its solder pad. As shown in FIG. 6B, a controlled amount of force represented by arrows 602 is applied to chip 110 while chip surface 111 is parallel to flat plate surface 505. Tip 305 of solder bump 304 becomes compressed against flat plate 504. At the same time, tip 307 of coated solder bump 306 is compressed so that the bulk material of coated solder bump 306 is forced through foreign material 314, thereby exposing the bulk material of the coated solder bump 306 at its tip 307. By exposing the bulk material of coated solder bumps, the solder bump surface quality is improved, and the solder bumps that were coated with foreign material at their tips will have an increased likelihood of forming good joints with their solder pads.

Figure 7:
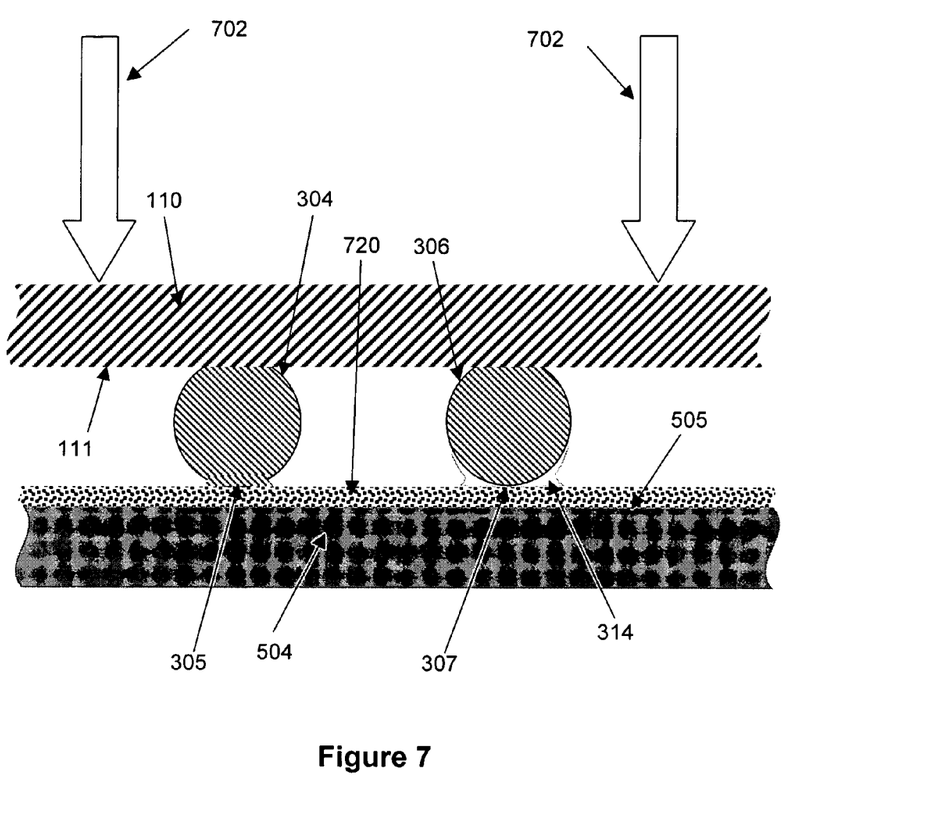
FIG. 7 is a cross-sectional view of yet another embodiment of the invention in which a layer of particles is dispersed and firmly held in place on the surface of a flat plate before the electronic device is placed adjacent to and forced against the layer of particles.

In yet another embodiment of the present invention shown in FIG. 7, a layer of particles is applied to a surface of a flat plate, and the electronic device is placed adjacent to and forced against the layer of particles, the layer of particles being firmly held in place. Particle layer 720 is comprised of an abrasive electroconductive material that is harder than foreign material 314. For example, the particles are diamond particles. The electroconductivity of particle layer 720 provides electrostatic discharge protection for chip 110. Chip 110 is positioned against flat plate 504 such that solder bump 304 and coated solder bump 306 are adjacent to particle layer 720. A controlled amount of force represented by arrows 702 is then applied, causing the particles of particle layer 720 to puncture foreign material 314.

Figure 8:
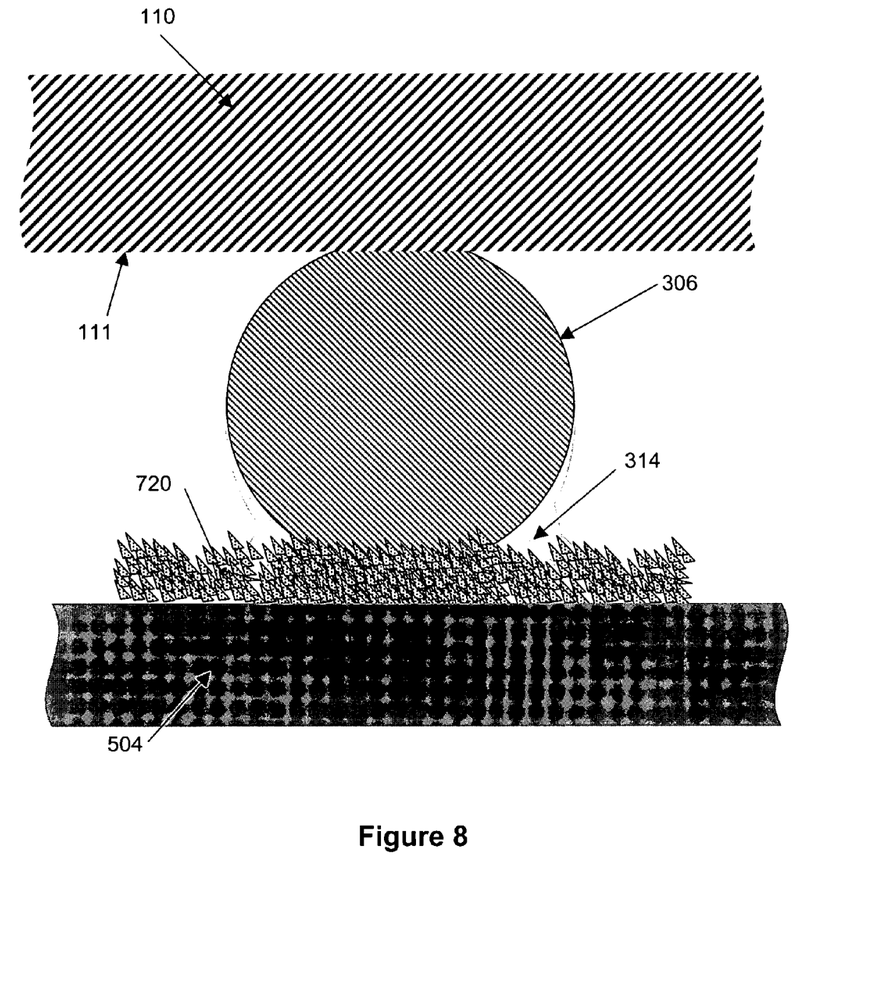
FIG. 8 is a close up view of the embodiment illustrated in FIG. 7.
Figure 9:
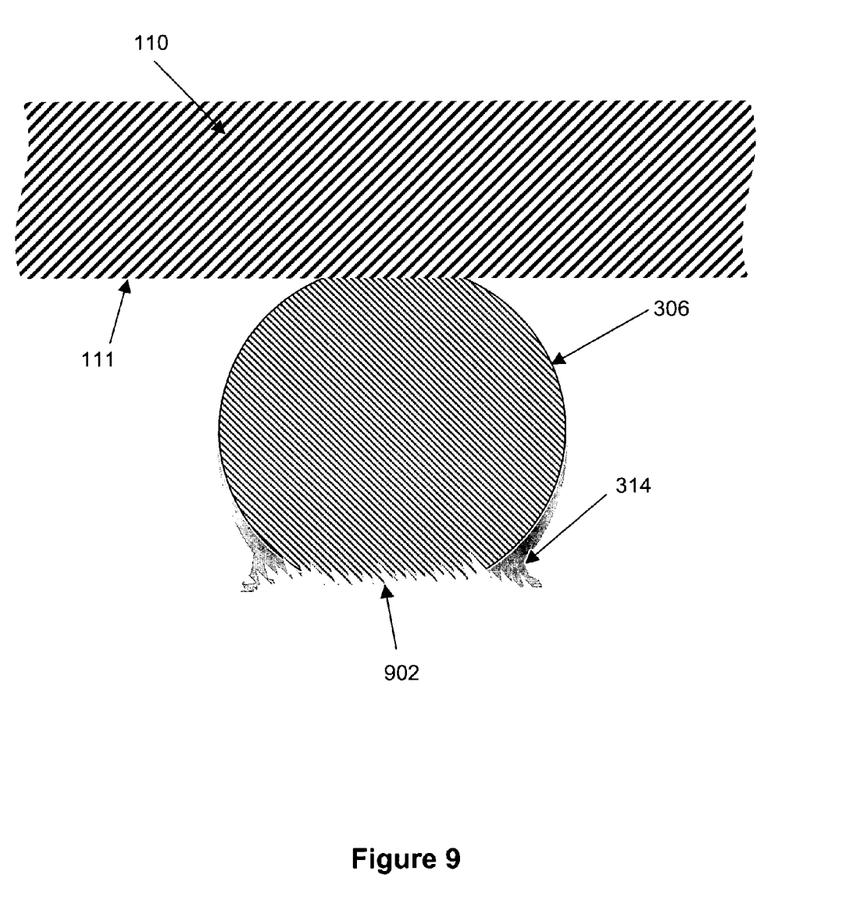
FIG. 9 is another close up view of the embodiment illustrated in FIG. 7, after the electronic device is removed from the flat plate.

FIG. 8 is a close up view of coated solder bump 306 and foreign material 314, where foreign material 314 is punctured by the particles of particle layer 720. Prior to packaging, chip 110 is removed from flat plate 504, leaving particle layer 720 behind, thereby exposing the bulk material of solder bump 306. FIG. 9 is a close up view of coated solder bump 306 and foreign material 314 after chip 110 is removed from flat plate 504, leaving the bulk material of coated solder bump 306 exposed at area 902. In yet another embodiment, a portion of foreign material 314 is left behind when chip 110 is removed from flat plate 504.

In a further embodiment, the particle layer utilized has a planar surface and is comprised of a material that is not only abrasive, electroconductive, and harder than the foreign material that coats the solder bumps, but is a material that is harder than the bulk material of the solder bumps. This planar quality and hardness of the particle layer serves to decrease the non-coplanarity of the solder bumps.

In yet a further embodiment, rather than a separate particle layer applied to a surface of a flat plate, the flat plate is composed of a material that is harder than the solder bumps, and the surface of the flat plate that contacts the solder bumps has an abrasive structure.

The foregoing description, for purposes of explanation, used specific examples to provide a thorough understanding of the invention. However, it will be apparent to one skilled in the art that the invention is not limited to these examples. The embodiments were chosen and described in order to best explain the principles of the invention and its practical applications, to thereby enable others skilled in the art to best utilize the invention and various embodiments with various modifications as are suited to the particular use contemplated. Thus, the foregoing disclosure is not intended to be exhaustive or to limit the invention to the precise forms disclosed. Many modifications and variations are possible in view of the above teachings.

It is intended that the scope of the invention be defined by the following claims and their equivalents.

What is claimed is:

1. A method of processing an electronic device, the electronic device having a chip surface and solder bumps on the chip surface, wherein at least one solder bump is coated with a foreign material different from the bulk material of the solder bumps, the method comprising:

dispersing a layer of particles on a surface of a flat plate, the particles being composed of an electroconductive material that is abrasive and harder than the foreign material, and being firmly held in place;

positioning the electronic device against the flat plate surface, wherein the chip surface faces the surface and the solder bumps contact the layer of particles;

pressing together the electronic device and flat plate with a controlled amount of force while the chip surface is parallel with the flat plate surface, such that the distance between the two surfaces is decreased and at least some of the foreign material becomes embedded in the layer of particles; and removing the electronic device from the flat plate leaving some of the foreign material of at least one solder bump in the layer of particles and exposing the bulk material of that solder bump.

2. The method of claim 1, wherein the particles are diamond particles.

3. The method of claim 1, wherein the particles are composed of a material that is harder than the bulk material of the solder bumps.

4. The method of claim 3, wherein the surface of the layer of particles that contacts the solder bumps is planar.

* * * * *